(12) United States Patent
Coolbaugh et al.

(10) Patent No.: US 8,390,038 B2
(45) Date of Patent: Mar. 5, 2013

(54) MIM CAPACITOR AND METHOD OF MAKING SAME

(75) Inventors: Douglas Duane Coolbaugh, Highland, NY (US); Ebenezer E. Eshun, Newburgh, NY (US); Zhong-Xiang He, Essex Junction, VT (US); Robert Mark Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 474 days.

(21) Appl. No.: 12/133,425

(22) Filed: Jun. 5, 2008

(65) Prior Publication Data

US 2008/0232025 A1 Sep. 25, 2008

Related U.S. Application Data

(63) Continuation of application No. 11/425,549, filed on Jun. 21, 2006, now Pat. No. 7,488,643.

(51) Int. Cl.
*H01L 27/108* (2006.01)
*H01L 29/94* (2006.01)

(52) U.S. Cl. ................. 257/256; 257/E27.048
(58) Field of Classification Search .................. 257/296, 257/E27.048
See application file for complete search history.

(56) References Cited

U.S. PATENT DOCUMENTS

| | | | |
|---|---|---|---|
| 6,180,976 B1 | 1/2001 | Roy | |
| 6,313,003 B1 | 11/2001 | Chen | |
| 6,451,664 B1 | 9/2002 | Barth et al. | |
| 6,466,427 B1 | 10/2002 | Chen | |
| 6,630,380 B1 | 10/2003 | Cheng et al. | |
| 6,746,914 B2* | 6/2004 | Kai et al. | 438/253 |
| 6,876,028 B1 | 4/2005 | Coolbaugh et al. | |
| 6,949,442 B2 | 9/2005 | Barth et al. | |
| 7,060,557 B1 | 6/2006 | Zhao et al. | |
| 2001/0020713 A1* | 9/2001 | Yoshitomi et al. | 257/306 |
| 2002/0175142 A1* | 11/2002 | Maejima | 216/6 |
| 2002/0179955 A1* | 12/2002 | Morimoto et al. | 257/306 |
| 2003/0089937 A1* | 5/2003 | Yamauchi et al. | 257/296 |
| 2003/0102531 A1* | 6/2003 | Joshi et al. | 257/629 |
| 2003/0170962 A1* | 9/2003 | Yasuda | 438/396 |
| 2003/0231458 A1 | 12/2003 | Hong et al. | |
| 2004/0126981 A1 | 7/2004 | Rao et al. | |
| 2004/0145855 A1* | 7/2004 | Block et al. | 361/309 |
| 2004/0152256 A1 | 8/2004 | Noguchi et al. | |
| 2004/0152258 A1 | 8/2004 | Kiyotoshi | |
| 2004/0209466 A1* | 10/2004 | Liu et al. | 438/687 |

(Continued)

FOREIGN PATENT DOCUMENTS

CN 1230915 12/2005
JP 2003152085 A 5/2003

(Continued)

OTHER PUBLICATIONS

Notice of Allowance (Mail Date Oct. 2, 2008) for U.S. Appl. No. 11/425,549, filed Jan. 21, 2006.

(Continued)

*Primary Examiner* — Steven Loke
*Assistant Examiner* — Igwe U Anya
(74) *Attorney, Agent, or Firm* — Schmeiser, Olsen & Watts; Yuanmin Cai (57) ABSTRACT

A MIM capacitor device and method of making the device. The device includes an upper plate comprising one or more electrically conductive layers, a dielectric block comprising one or more dielectric layers, a lower plate comprising one or more electrically conductive layer; and a spreader plate comprising one or more electrically conductive layers.

22 Claims, 9 Drawing Sheets

U.S. PATENT DOCUMENTS

| | | | |
|---|---|---|---|
| 2004/0262655 A1* | 12/2004 | Kweon | 257/295 |
| 2005/0062130 A1* | 3/2005 | Ciancio et al. | 257/532 |
| 2005/0067701 A1* | 3/2005 | Coolbaugh et al. | 257/751 |
| 2005/0093093 A1* | 5/2005 | Burke et al. | 257/532 |
| 2005/0095781 A1* | 5/2005 | Papa Rao et al. | 438/250 |
| 2005/0112836 A1* | 5/2005 | Kim et al. | 438/307 |
| 2005/0242377 A1* | 11/2005 | Eguchi et al. | 257/240 |
| 2005/0277208 A1* | 12/2005 | Nakazawa et al. | 438/3 |
| 2005/0282346 A1* | 12/2005 | Barth et al. | 438/303 |
| 2006/0006447 A1 | 1/2006 | Kim et al. | |
| 2006/0014356 A1 | 1/2006 | Hsu et al. | |
| 2006/0030101 A1 | 2/2006 | Shin | |
| 2006/0124983 A1* | 6/2006 | Kutsunai et al. | 257/306 |
| 2006/0189110 A1 | 8/2006 | Mandelman et al. | |
| 2007/0037450 A1* | 2/2007 | Wu | 439/610 |
| 2007/0291447 A1* | 12/2007 | Nakajima et al. | 361/683 |

FOREIGN PATENT DOCUMENTS

| | | |
|---|---|---|
| JP | 2004079924 A | 3/2004 |
| JP | 2005175491 A | 6/2005 |

OTHER PUBLICATIONS

Information Materials for IDS Report dated Nov. 27, 2012, Prepared by Shinya Mayama; JPO Office Action dated Nov. 6, 2012, Application No. 2007-160933.

* cited by examiner

MIM CAPACITOR AND METHOD OF MAKING SAME

This application is a continuation of U.S. patent application Ser. No. 11/425,549 filed on Jun. 21, 2006.

FIELD OF THE INVENTION

The present invention relates to the field of integrated circuits; more specifically, it relates to a metal-insulator-metal (MIM) capacitor for use in integrated circuits and the method of fabricating MIM capacitors.

BACKGROUND OF THE INVENTION

MIM capacitors are used where relatively large value capacitors are required by integrated circuits. MIM capacitors are generally fabricated in the wiring levels of integrated circuits. However, current MIM capacitors suffer from high plate resistance and are difficult to integrate into copper wiring technology. Therefore, there is a need for a MIM capacitor structure having reduced plate resistance and that is easily integrated into copper wiring technology.

SUMMARY OF THE INVENTION

A first aspect of the present invention is a device, comprising: an upper plate comprising one or more electrically conductive layers, the upper plate having a top surface, a bottom surface and sidewalls; a spreader plate comprising one or more electrically conductive layers, the spreader plate having a top surface, a bottom surface and sidewalls; and a dielectric block comprising one or more dielectric layers the dielectric block having a top surface, a bottom surface and sidewalls, the top surface of the dielectric block in physical contact with the bottom surface of the upper plate, the bottom surface of the dielectric block over the top surface of the spreader plate, the sidewalls of the upper plate and the dielectric block essentially co-planer.

A second aspect of the present invention is a method, comprising: forming one or more copper lower interconnects in a first interlevel dielectric layer; forming a first intermediate dielectric layer on a top of the first interlevel dielectric layer; forming a trench in the first intermediate dielectric layer, top surfaces of the one or more lower interconnects exposed in a bottom of the trench; forming an electrically conductive spreader plate in and completely filling the trench, a bottom surface of the spreader plate in physical and electrical contact with the one or more copper lower interconnects; forming a MIM dielectric block over a top surface of the spreader plate; forming an electrically conductive upper plate on a top surface of the MIM dielectric block, sidewalls of the upper plate and the MIM dielectric plate essentially co-planer; forming a second intermediate dielectric layer on top of the first intermediate dielectric layer, a top surface of the second intermediate dielectric layer coplanar with a top surface of the upper plate; forming a second interlevel dielectric layer on the top surfaces of the second intermediate dielectric layer and the upper plate; and forming one or more copper upper interconnects in the second interlevel dielectric layer, the one or more upper interconnects in physical and electrical contact with the top surface of the upper plate.

A third aspect of the present invention is a method, comprising: forming one or more copper lower interconnects in a first interlevel dielectric layer; forming a first intermediate dielectric layer on top of the first interlevel dielectric layer; forming a trench in the first intermediate dielectric layer, top surfaces of the one or more the lower interconnects exposed in a bottom of the trench; forming an electrically conductive spreader plate layer on the bottom and on sidewalls of the trench, the spreader plate layer in physical and electrical contact with the one or more copper lower interconnects; forming a MIM dielectric layer over a top surface of the spreader plate layer; forming an electrically conductive upper plate layer on a top surface of the MIM dielectric layer; removing regions of the spreader plate layer, the MIM dielectric layer and the upper plate layer to form a spreader plate, a MIM dielectric block and an upper plate, sidewalls of the spreader plate, the MIM dielectric block and the upper plate essentially co-planer; forming a second intermediate dielectric layer on top of the first intermediate dielectric layer, a top surface of the second intermediate dielectric layer coplanar with a top surface of the upper plate; forming a second interlevel dielectric layer on the top surfaces of the second intermediate dielectric layer and the upper plate; and forming one or more copper upper interconnects in the second interlevel dielectric layer, the one or more upper interconnects in physical and electrical contact with the top surface of the upper plate.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

A damascene process is one in which wire trenches or via openings are formed in a dielectric layer, an electrical conductor of sufficient thickness to fill the trenches is deposited on a top surface of the dielectric, and a chemical-mechanical-polish (CMP) process is performed to remove excess conductor and make the surface of the conductor co-planar with the surface of the dielectric layer to form damascene wires (or damascene vias). When only a trench and a wire (or a via opening and a via) is formed the process is called single-damascene.

A dual-damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is deposited on a top surface of the dielectric and a CMP process is performed to male the surface of the conductor in the trench co-planar with the surface the dielectric layer to form dual-damascene wires and dual-damascene wires having integral dual-damascene vias. Alternatively, the trenches may be formed before the via openings.

The embodiments of the present invention will be illustrated using dual-damascene wires. Single-damascene wires and/or vias may be substituted for one or both of the two dual damascene wiring levels described infra.

Figure 1A:
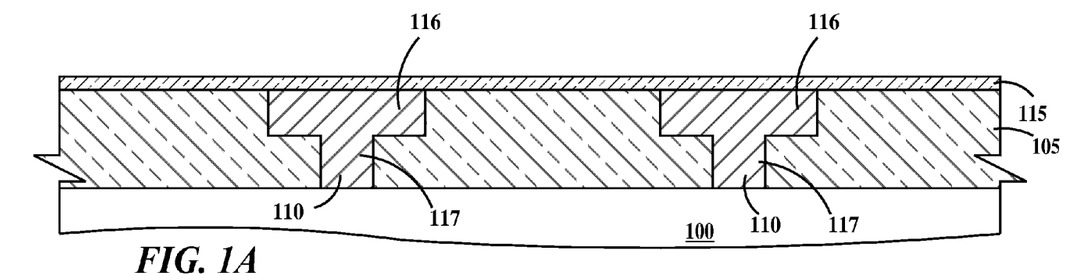
FIGS. 1A through 1H are cross-sectional diagrams illustrating a method of fabricating a MIM capacitor is according to a first embodiment of the present invention.

FIGS. 1A through 1H are cross-sectional diagrams illustrating a method of fabricating a MIM capacitor is according to a first embodiment of the present invention. In FIG. 1A, formed on a substrate (or lower wiring level) 100 is a inter-level dielectric layer (ILD) 105. Formed in ILD 105 are dual-damascene wires 110 comprising wire portions 116 and integral via portions 117. ILD 105 and wires 110 comprise a normal wiring level of an integrated circuit chip. Wires 110 are an example of an integrated circuit interconnect structure. Other interconnect structures include via bars and stud contacts. Via portions 117 may physically and electrically contact devices such as transistors or wires in substrate/lower wiring level 100. While two wires 110 are illustrated in FIG. 1A, one or more wires may be formed, see for example, FIG. 3. Formed on top of ILD 105 is an optional dielectric layer 115. Dielectric layer 115 may function as a copper diffusion barrier.

In one example, wires 110 comprise a copper core conductor and an electrically conductive liner on all surfaces of the wires except those surfaces in contact with diffusion barrier 115. In one example, liners comprise a layer of tantalum, a layer of tantalum nitride, a layer of tungsten, a layer of titanium, a layer of titanium nitride or combinations of layers thereof.

In one example, ILD 105 comprises a layer of silicon dioxide ($SiO_2$), a layer of a low K (dielectric constant) material, a layer of hydrogen silsesquioxane polymer (HSQ), a layer of methyl silsesquioxane polymer (MSQ), a layer of SiLK™ (polyphenylene oligomer) manufactured by Dow Chemical, Midland, Tex., a layer of Black Diamond™ (methyl doped silica or $SiO_x(CH_3)_y$ or $SiC_xO_yH_y$ or SiOCH) manufactured by Applied Materials, Santa Clara, Calif., a layer of organosilicate glass (SiCOH), a layer of porous SiCOH or combinations of layers thereof. In one example, ILD 105 is between about 300 nm and about 2,000 nm thick. A low K dielectric material has a relative permittivity of about 2.4 or less.

In one example dielectric layer 115 comprises a layer of $SiO_2$, a layer of silicon nitride ($Si_3N_4$), a layer of silicon carbide (SiC), a layer of silicon oxy nitride (SiON), a layer of silicon oxy carbide (SiOC), a layer of organosilicate glass (SiCOH), a layer of plasma-enhanced silicon nitride ($PSiN_x$), a layer of NBLok (SiC(N,H)) or combinations of layers thereof. In one example, dielectric layer 115 is about 5 nm to about 200 nm thick.

Figure 1B:
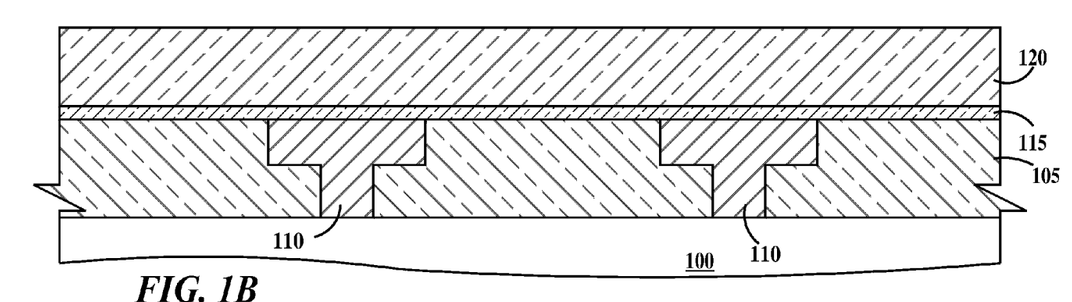

In FIG. 1B, an intermediate dielectric layer 120 is formed on top of dielectric layer 115. In one example, dielectric layer 120 comprises a layer of $SiO_2$ or a layer of fluoro-silicate glass (FSG). In one example, dielectric layer 120 is between about 500 nm and about 2000 nm thick.

Figure 1C:
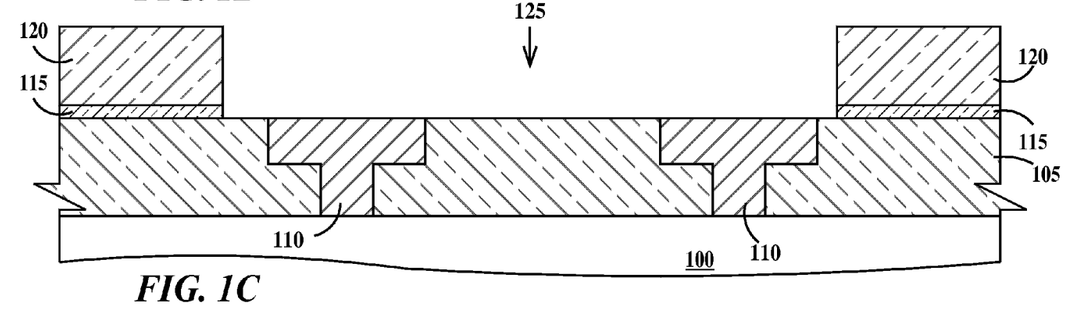

In FIG. 1C, a trench 125 is formed in dielectric layer 120 and dielectric layer 115 exposing top surfaces of ILD layer 105 and wires 110 in the bottom of the trench.

Figure 1D:
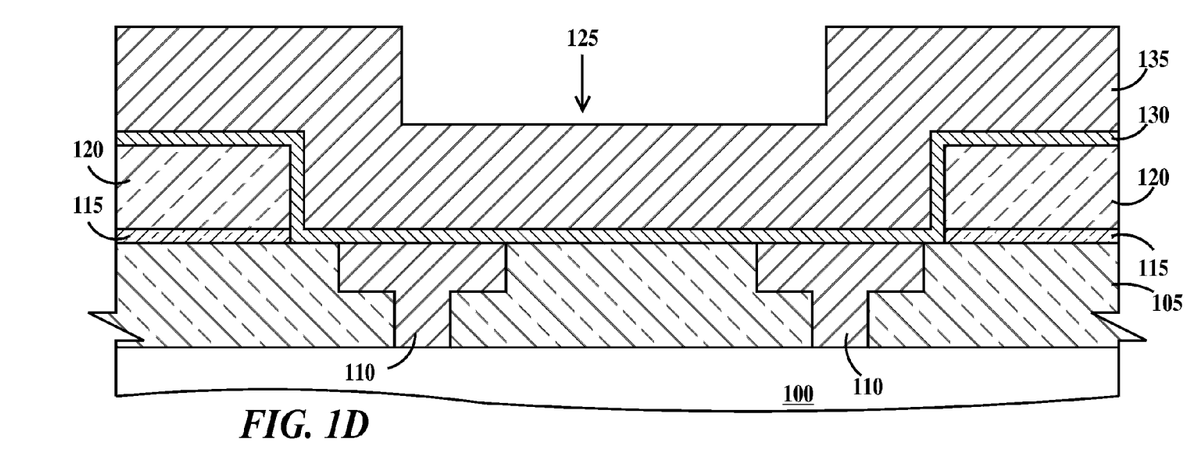

In FIG. 1D, an optional electrically conductive and conformal liner 130 is deposited in trench 125 and on all exposes surfaces of dielectric layer 120. Then an electrically conductive refractory metal layer 135 is formed over liner 130. In one example liner 130 comprises a layer of titanium nitride or a layer of tantalum nitride or layers thereof. In one example, liner 130 is between about 5 nm and about 20 nm thick. In one example layer 135 comprises a layer of tantalum or a layer of tungsten or combinations of layers thereof. In one example, layer 135 is between about 50 nm and about 200 nm thick.

Figure 1E:
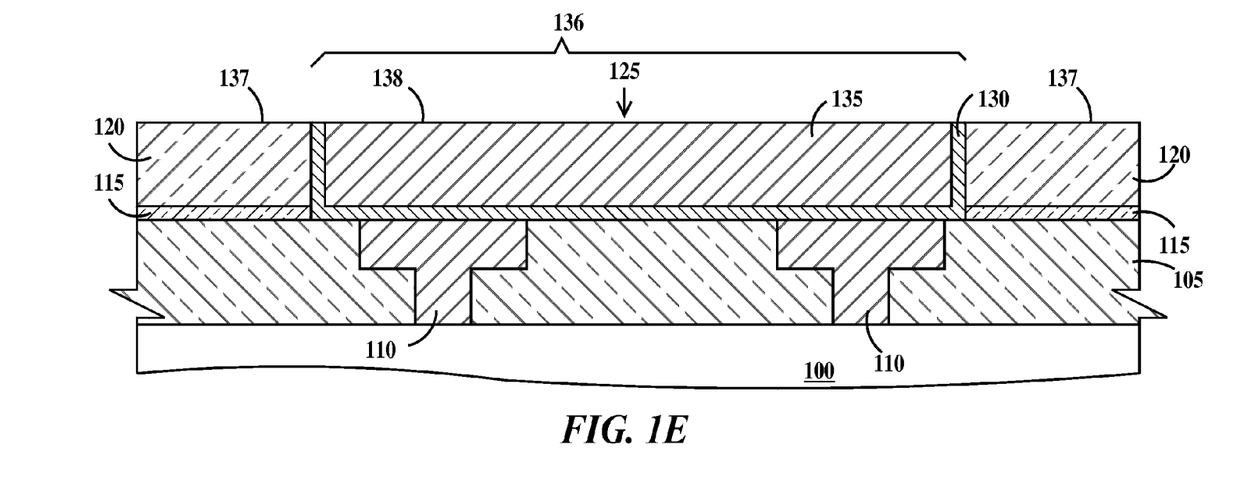

In FIG. 1E, a chemical-mechanical-polish (CMP) is performed removing all liner 130 and layer 135 from over dielectric layer 120 to form a spreader plate 136 and co-planarizing a top surface 137 of dielectric layer 120 and a top surface 138 of spreader plate 136.

Figure 1F:
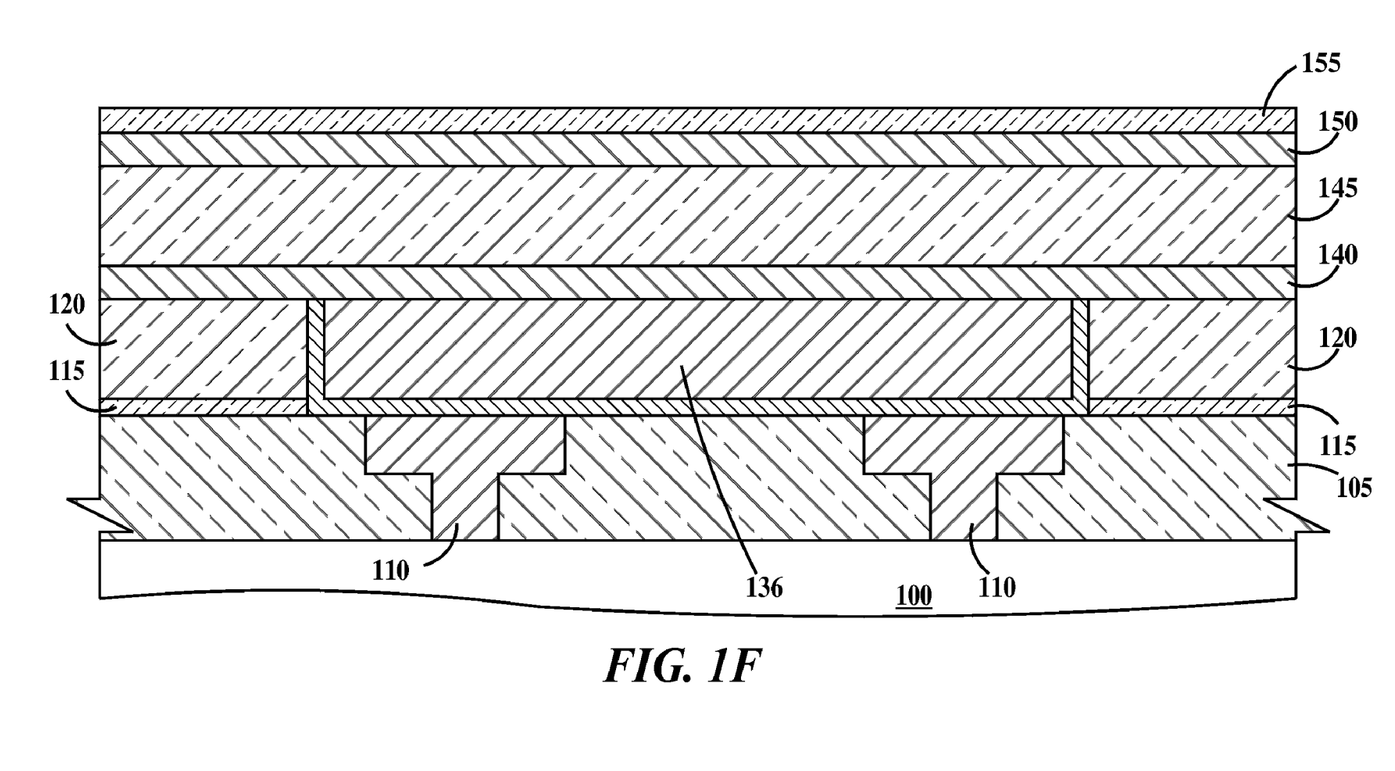

In FIG. 1F, a first electrically conductive layer 140 is formed over spreader plate 136, a MIM dielectric layer 145 is formed over first conductive layer 140 and a second conductive layer 150 is formed over MIM dielectric layer 145. Then an optional dielectric layer 155 is formed over second conductive layer 150. Dielectric layer 155 may function as an etch stop layer in subsequent damascene processing of the MIM capacitor.

In one example, layers 140 and 150 may independently comprise a layer of tantalum, a layer of tantalum nitride, a layer of titanium, a layer of titanium nitride, a layer of tungsten or combinations of layers thereof. In one example layer 140 is about 5 nm and about 20 nm thick. In one example layer 150 is about 30 nm and about 150 nm thick. Materials for dielectric layer 155 may be selected from those discussed supra for dielectric layer 115.

In one example, MIM dielectric layer 145 comprises a layer of silicon dioxide ($SiO_2$), a layer of silicon nitride ($Si_3N_4$), a layer of silicon carbide (SiC), a layer of silicon oxy nitride (SiON), a layer of silicon oxy carbide (SiOC), a layer of organosilicate glass (SiCOH), a layer of plasma-enhanced silicon nitride ($PSiN_x$). a layer of NBLok (SiC(N,H)) or combinations of layers thereof. In one example gate MIM dielectric layer 145 is a high K (dielectric constant) material, examples of which include but are not limited to layers of metal oxides such as $Ta_2O_5$, $BaTiO_3$, $HfO_2$, $ZrO_2$, $Al_2O_3$, or layers of metal silicates such as $HfSi_xO_y$ or $HfSi_xO_yN_z$ or combinations of layers thereof. A high K dielectric material has a relative permittivity above about 10. In one example, MIM dielectric layer 145 is about 10 nm to about 50 nm thick.

Figure 1G:
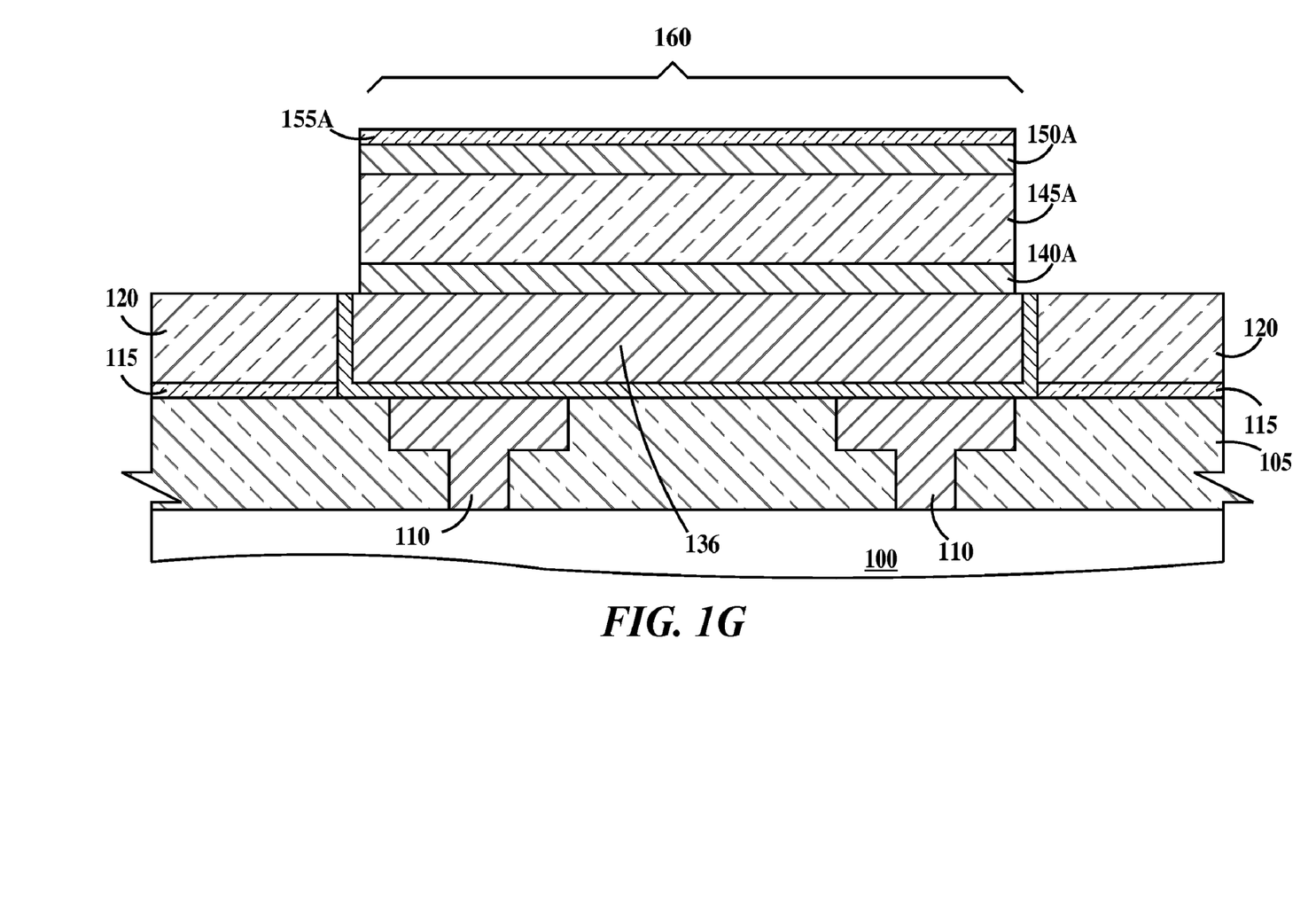

In FIG. 1G, an etch is performed to remove unwanted portions of layer 140, MIM dielectric layer 145, layer 150 and layer 155 (see FIG. 1F) to form a MIM capacitor 160 comprising respective lower plate 140A, a block of MIM dielectric 145A and upper plate 150A. The top surface of MIM capacitor 160 is covered by an optional dielectric plate 155A. This may be accomplished by one or more reactive ion etch (RIE) processes through a patterned a photomask or a patterned hardmask defined by a patterned photomask as is known in the art. The sidewalls of lower plate 140A, block of MIM dielectric 145A and upper plate 150A are aligned over each other (e.g. the sidewalls of lower plate 140A, block of MIM dielectric 145A and upper plate 150 are essentially co-planer, allowing for slight undercutting if any). It should be noted that alternatively, lower plate 140A may not be formed and spreader plate 136 may serve as the lower plate of MIM capacitor 160.

In one example, MIM capacitor 160 is fully landed on spreader plate 136, (e.g. MIM capacitor does not extend over dielectric layer 120. First and second layers 140 and 150 may function as copper diffusion barrier layers, adhesion layers or both as diffusion barrier and adhesion layers as well as being the top and lower plates.

Figure 1H:
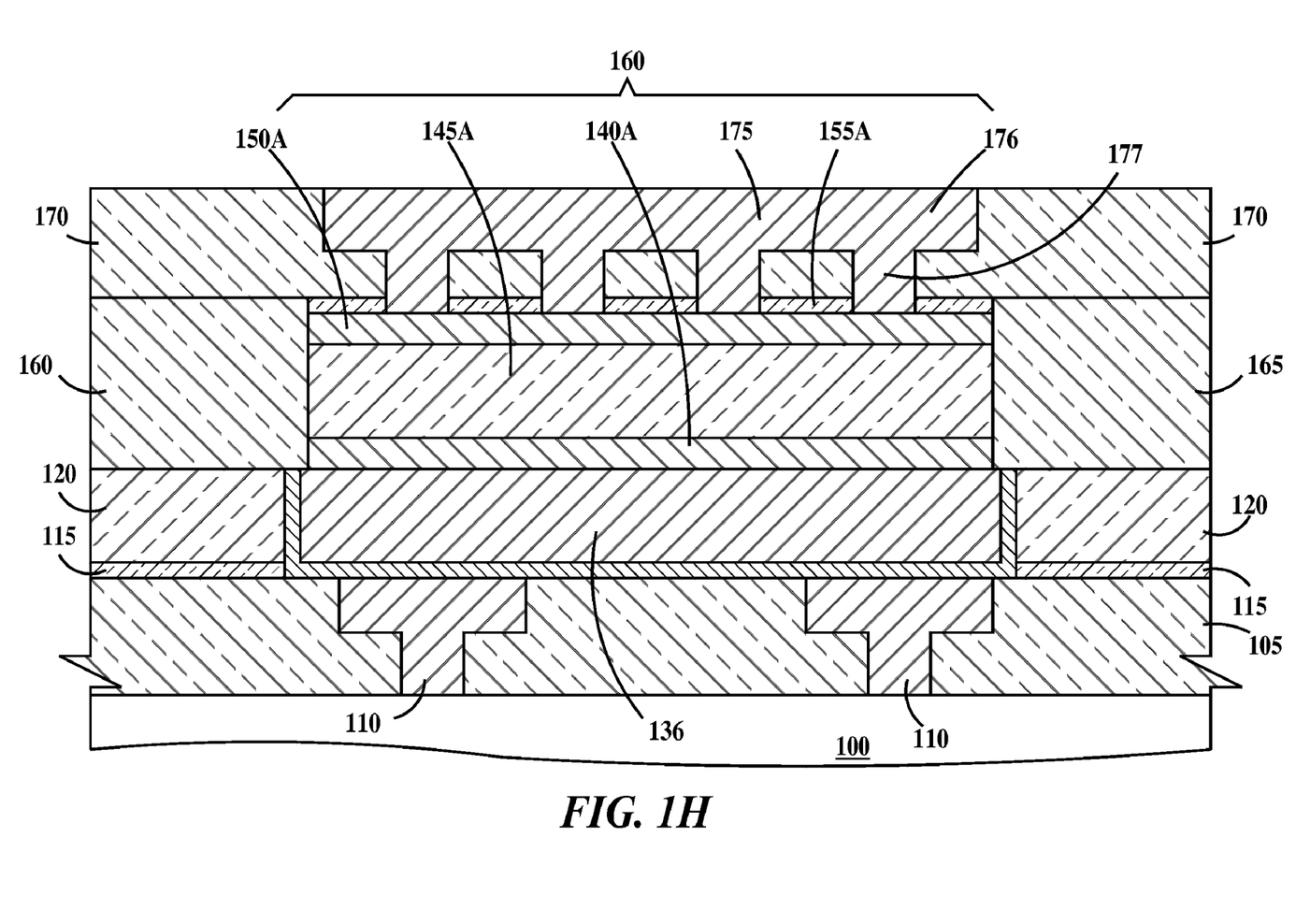

In FIG. 1H, an intermediate dielectric layer 165 is formed over dielectric layer 120 and top surfaces of dielectric plate 155A and top surface of dielectric plate 155A is co-planarized, (for example, by CMP) with a top surface of dielectric layer 165. Then an ILD layer 170 formed on dielectric layer 165 and dielectric plate 155A. Formed in ILD 170/dielectric plate 155A is a dual-damascene wire 175 comprising a respective wire portion 176 and integral via portions 177. ILD 70 and wire 170 comprise a normal wiring level of the integrated circuit chip. Via portions 177 physically and electrically contact upper plate 150A. Wire 175 is an example of an interconnect structure.

Materials for intermediate dielectric layer 165 may be selected from those discussed supra for dielectric layer 120. Materials for ILD layer 170 may be selected from those discussed supra for ILD layer 105. Materials for wire 175 may be selected from those discussed supra for wires 110.

FIGS. 2A through 2D are cross-sectional diagrams illustrating a method of fabricating a MIM capacitor is according to a second embodiment of the present invention. The steps illustrated in FIGS. 1A, 1B and 1C and described supra in reference to the first embodiment of the present invention are performed and then optional liner 130, layer 135, layer 140, MIM dielectric layer 145, layer 150 and layer 155 are formed in sequence in trench 125 and over dielectric layer 115. The composition and thicknesses of liner 130, layer 135, layer 140, MIM dielectric layer 145 and layer 150 have been described supra.

Figure 2A:
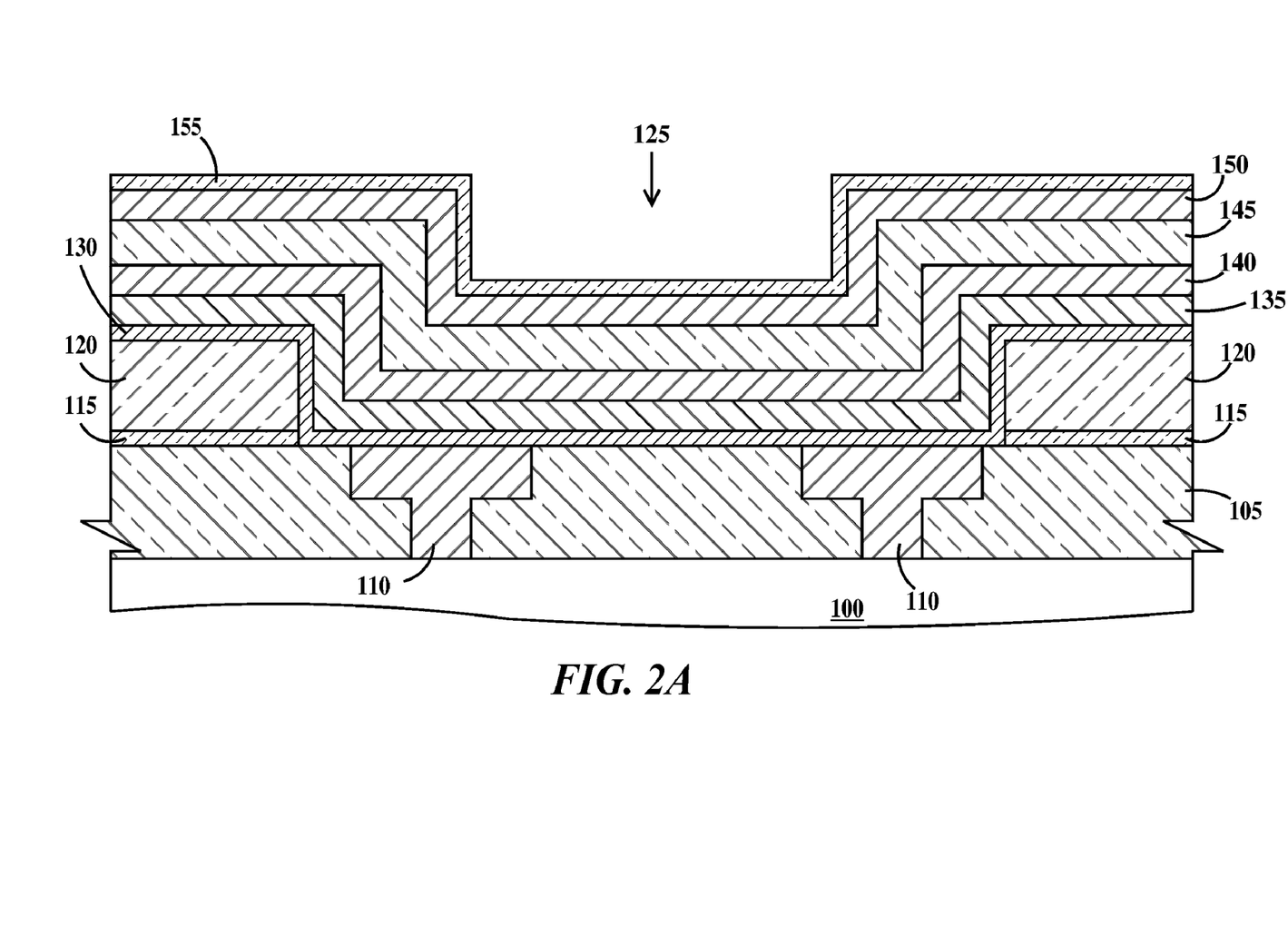
FIGS. 2A through 2D are cross-sectional diagrams illustrating a method of fabricating a MIM capacitor is according to a second embodiment of the present invention.
Figure 2B:
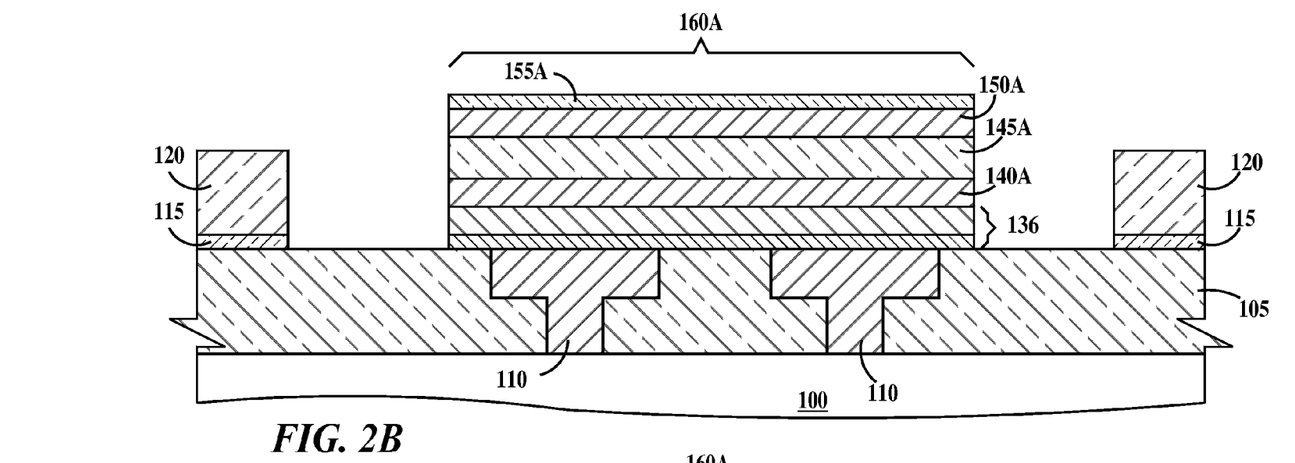

In FIG. 2B, an etch is performed to remove unwanted portions of liner 130, layer 140, MIM dielectric layer 145, layer 150 and layer 155 (see FIG. 2A) to form spreader plate 136 and a MIM capacitor 160A comprising respective lower plate 140A, MIM dielectric 145A and upper plate 150A. The top surface of MIM capacitor 160A is covered by optional dielectric plate 155A. This may be accomplished by RIE through a patterned a photomask or a patterned hardmask defined by a patterned photomask as is known in the art. The sidewalls of spreader plate 136, lower plate 140A, block of MIM dielectric 145A and upper plate 150A are aligned over each other (e.g. the sidewalls of lower plate 140A, block of MIM dielectric 145A and upper plate 150 are essentially co-planer, allowing for slight undercutting if any). Alternatively, if layer 140 (see FIG. 2A) is not formed and thus lower plate 140A is not formed and spreader plate 136 will serve as the lower plate of MIM capacitor 160A.

Figure 2C:
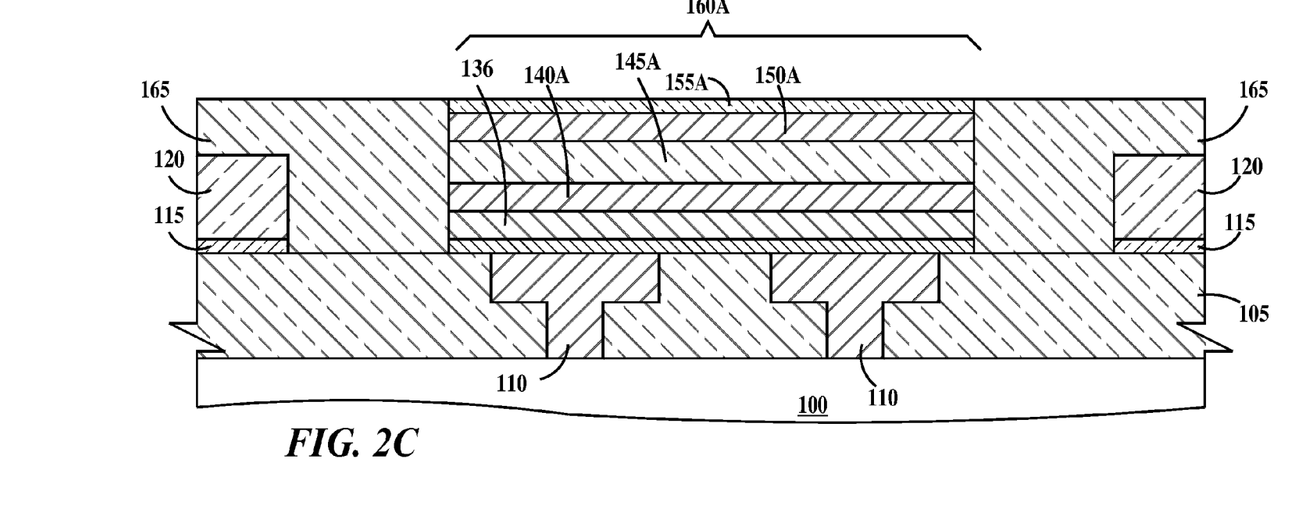

In FIG. 2C, dielectric layer 165 is formed over dielectric layer 120 and exposed surfaces of ILD 105, spreader plate 136, MIM capacitor 160A and dielectric block 155A. Then top surfaces of dielectric layer 160 dielectric block 155A co-planarized, (for example, by CMP).

Figure 2D:
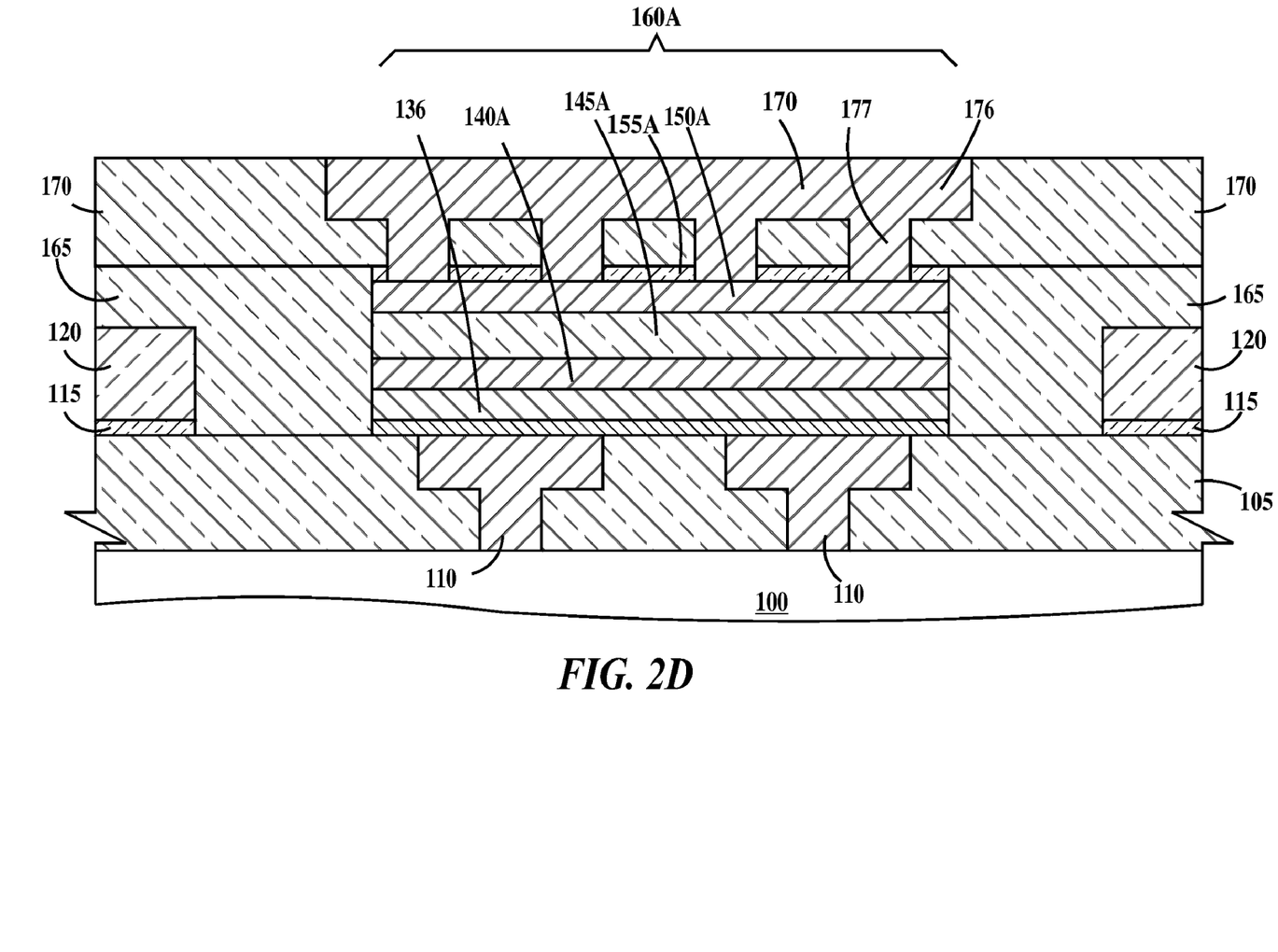

In FIG. 2D, ILD layer 170 is formed on dielectric layer 155 and dielectric 165. Formed in ILD 170/dielectric block 155A is dual-damascene wire 175 comprising respective wire portion 176 and integral via portions 177. ILD 170 and wire 170 comprise a normal wiring level of the integrated circuit chip. Via portions 177 physically and electrically contact upper plate 150A.

Figure 3:
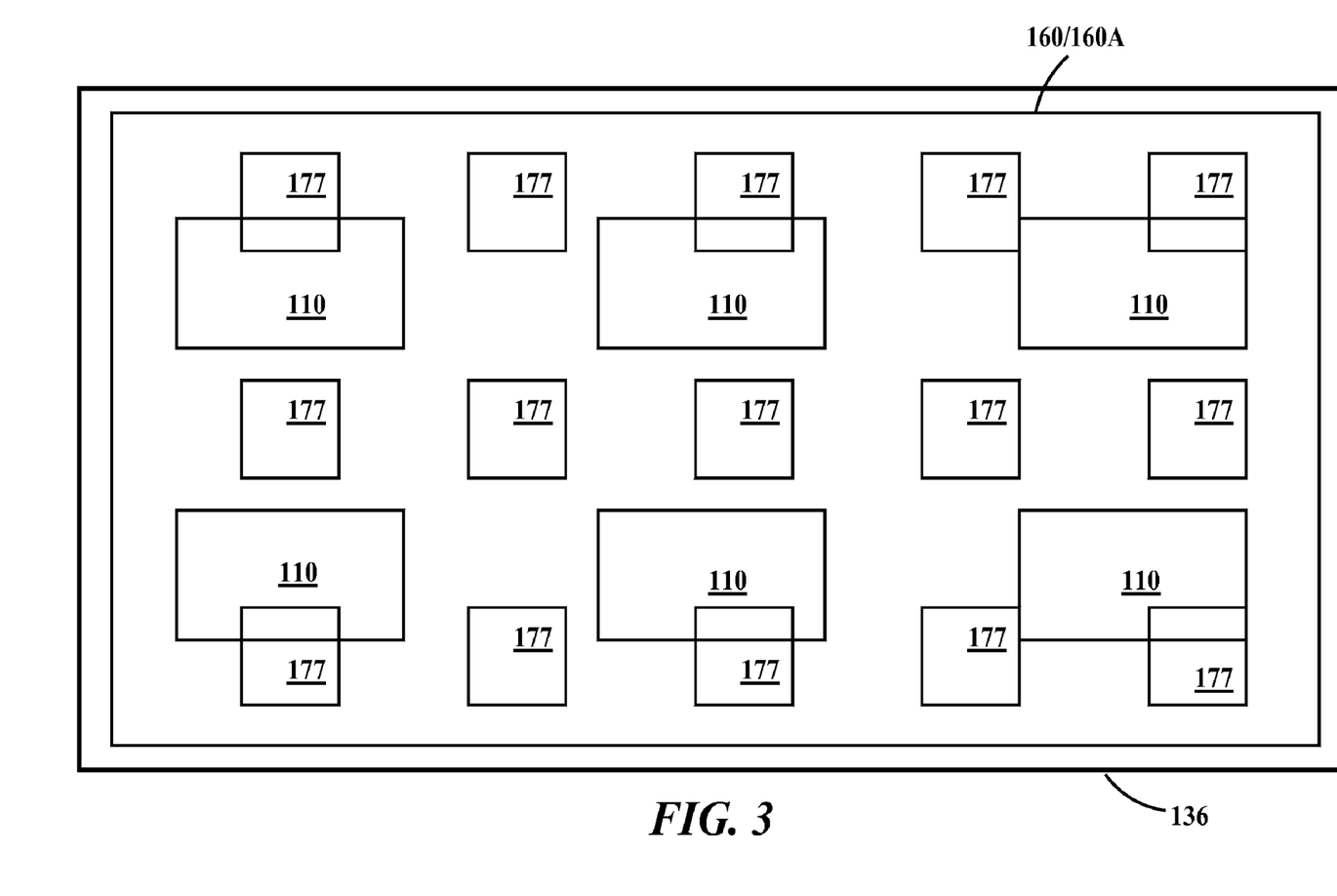
FIG. 3 is a top view of the MIM capacitor according to the embodiments of the present invention.

FIG. 3 is a top view of the MIM capacitor according to the embodiments of the present invention. In FIG. 3. it can be seen that an array of wires 110 are distributed under MIN capacitor 160 in order to spread out the current and that edges of spreader plate 136 extends past edges of MIM capacitor 160. (For MIM capacitor 160A, the edges of spreader plate 136 would be aligned to the edges of the MIM capacitor.) Spreader plate 136 reduces the resistance of the contact between wires 170 and MIM capacitor 160/160A. For MIM capacitor 160A, spreader plate 136 defines the area of the capacitor. For MIM capacitor 160, spreader plate 136 defines a maximum area of the capacitor. An array of vias 177 spreads the current load over the area of MIM capacitor 160/160A.

Thus, the embodiments of the present invention provide a MIM capacitor structure having reduced plate resistance and that is easily integrated into copper wiring technology The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. A device, comprising:
    an upper plate comprising one or more electrically conductive layers, said upper plate having a top surface, a bottom surface and sidewalls;
    a dielectric block comprising one or more dielectric layers said dielectric block having a top surface, a bottom surface and sidewalls, said top surface of said dielectric block in physical contact with said bottom surface of said upper plate;
    a lower plate comprising one or more electrically conductive layers, said lower plate having a top surface, a bottom surface and sidewalls, said top surface of said lower plate in physical contact with said bottom surface of dielectric block;
    a spreader plate comprising one or more electrically conductive layers, said spreader plate having a top surface, a bottom surface and sidewalls, a top surface of said spreader plate in physical and electrical contact with all of said bottom surface of said lower plate;
    a dual-damascene upper wire, said dual-damascene upper wire comprising a first wire region and multiple and integral first via regions, said first wire region and said integral first via regions formed in a same first interlevel dielectric layer, said first via regions in physical and electrical contact with said top surface of said upper plate, regions of said same first interlevel dielectric layer intervening between said via portions and between a bottom surface of said wire region between said via regions;
    two or more dual-damascene lower wires, each of said two or more dual-damascene lower wires having a second wire region and an integral second via region, the second wire regions and the integral second via regions formed in a same second interlevel dielectric layer, the second wire regions in physical and electrical contact with said bottom surface of said spreader plate; and
    wherein said upper plate, said dielectric block and said lower plate are formed in and abut sidewalls of a same trench in an intermediate dielectric layer, said trench between said first interlevel dielectric layer and said second interlevel dielectric layer, said trench extending from a top surface of said dielectric layer to a bottom surface of said intermediate dielectric layer.

2. The device of claim 1, wherein said sidewalls of said spreader plate are co-planer with said sidewalls of said upper and lower plates and said dielectric block.

3. The device of claim 1, wherein perimeters of said upper plate, said lower plate and said dielectric block do not extend past a perimeter of said spreader plate.

4. The device of claim 1, wherein said sidewalls of said upper and lower plates and said dielectric block are coplanar and said spreader plate overlaps all sides of said sidewalls of said upper and lower plates and said dielectric block.

5. The device of claim 1, wherein said lower and upper wires comprise copper.

6. The device of claim 1, wherein said spreader plate comprises a layer of titanium nitride, a layer of tantalum nitride, a layer of tantalum, a layer of tungsten or layers thereof.

7. The device of claim 1, wherein said upper and lower plates independently comprise a layer of tantalum, a layer of tantalum nitride, a layer of titanium, a layer of titanium nitride, a layer of tungsten or combinations of layers thereof.

8. The device of claim 1, wherein said dielectric block comprises a layer of a metal oxide, a layer of $Ta_2O_5$, a layer of $BaTiO_3$, a layer of $HfO_2$, a layer of $ZrO_2$, a layer of $Al_2O_3$, a layer of a metal silicate, a layer of $HfSi_xO_y$, a layer of $HfSi_xO_yN_z$ or combinations of layers thereof.

9. The device of claim 1, wherein the area of said top surface of said lower plate defines the capacitive area of a metal-on-insulator capacitor comprising said lower plate, said dielectric block and said upper plate.

10. The device of claim 1, wherein said upper and lower plates each contain at least one electrically conductive layer that is a diffusion barrier to copper.

11. The device of claim 1, wherein said sidewalls of said upper and lower plates, said dielectric block and said spreader plate are coplanar.

12. The device of claim 1,
wherein perimeters of said second wire regions of each wire of said two or more dual-damascene lower wires are within a perimeter of said spreading plate.

13. The device of claim 1, wherein perimeters of each of said integral first via regions of said dual-damascene upper wire is within a perimeter of said spreading plate.

14. The device of claim 1,
wherein perimeters of each wire of said two or more dual-damascene lower wires are within a perimeter of said spreading plate and wherein respective perimeters of each of said multiple and integral first via regions of said dual-damascene upper wire are within a perimeter of said spreading plate.

15. The device of claim 1, further including:
wherein a first less than whole portion of said multiple and integral first via regions of said dual-damascene upper wire overlay corresponding one or more second wire regions of said two or more dual-damascene lower wires and a second less than whole portion of said multiple and integral first via regions of said dual-damascene upper wire do not overlay any wires of said two or more lower wires.

16. The device of claim 1, including:
said spreader plate comprising a top layer and a bottom layer;

said top layer in direct physical and electrical contact and coextensive with said bottom surface of said lower plate; and
said bottom layer in physical and electrical contact with top surfaces of said second wire regions of said two or more dual-damascene lower wires.

17. The device of claim 1, further including:
an additional dielectric layer, said additional dielectric layer abutting and between said second interlevel dielectric layer and said intermediate dielectric layer, an additional trench in said additional dielectric layer, said additional trench extending from a top surface to a bottom surface of said additional dielectric layer, said spreader plate formed only in and abutting sidewalls of said additional trench.

18. The device of claim 17, wherein said top surface of said spreader plate is coplanar with a top surface of said additional dielectric layer and said bottom surface of said spreader plate is coplanar with a bottom surface of said additional dielectric layer.

19. The device of claim 1, wherein a top surface of said upper plate is recessed below a top surface of said intermediate dielectric layer.

20. The device of claim 1, wherein said spreader plate comprises a core conductor having sidewalls and a bottom surface and an electrically conductive liner on said sidewalls and said bottom surface or said core and wherein said at least two edges of said spreader plate extends past at least two edges of said lower plate.

21. The device of claim 1, wherein said spreader plate is formed in said trench in said intermediate dielectric layer, said bottom surface of said spreader plate coplanar with a bottom surface of said intermediate dielectric layer.

22. The device of claim 21, further including:
an additional dielectric layer embedded in said intermediate dielectric, said additional dielectric layer in direct physical contact with a top surface of said lower interlevel dielectric layer, first regions of said intermediate dielectric layer intervening between a top surface of said additional dielectric layer and second regions of said additional dielectric layer intervening between said upper plate, said dielectric block, said lower plate and said spreader plate.

* * * * *